United States Patent [19]

Ryou

[11] Patent Number: 5,468,671
[45] Date of Patent: Nov. 21, 1995

[54] METHOD FOR FABRICATING STACKED CAPACITOR OF SEMICONDUCTOR MEMORY DEVICE

[75] Inventor: Eui K. Ryou, Kyoungki-do, Rep. of Korea

[73] Assignee: Hyundai Electronics Industries, Co. Ltd., Rep. of Korea

[21] Appl. No.: 341,765

[22] Filed: Nov. 18, 1994

[30] Foreign Application Priority Data

Nov. 19, 1993 [KR] Rep. of Korea ............ 93-24749

[51] Int. Cl.$^6$ .................. H01L 21/70; H01L 27/00
[52] U.S. Cl. .................. 437/52; 437/60; 437/919
[58] Field of Search .................. 437/47, 52, 60, 437/919

[56] References Cited

U.S. PATENT DOCUMENTS 5,330,614 7/1994 Ahn .............................. 156/631
5,389,560 2/1995 Park .............................. 437/52

Primary Examiner—Olik Chaudhuri
Assistant Examiner—H. Jey Tsai
Attorney, Agent, or Firm—Merchant, Gould, Smith, Edell, Welter & Schmidt

[57] ABSTRACT

A method for fabricating a capacitor of a semiconductor memory device, capable of obtaining a sufficient storage capacitance even when a memory cell area is reduced, thereby improving the integration degree of the semiconductor memory device. The method includes the steps of: forming a planarized insulating oxide film on a semiconductor substrate formed with a transistor having an impurity diffusion region; forming a contact hole by use of a contact hole mask; forming an electrode layer over the insulating oxide film such that the electrode layer is in electrical contact with the impurity diffusion region; forming a sacrificial oxide film pattern having a bird's beak shape on a portion of the electrode layer disposed around the contact hole; etching the electrode layer by use of the sacrificial oxide film pattern as an etch barrier until the insulating oxide film is exposed, thereby forming an electrode layer pattern; wet etching the sacrificial oxide film pattern, thereby exposing an upper surface of the electrode layer pattern; and sequentially forming a dielectric film and a plate electrode over the exposed surface of the electrode layer pattern.

21 Claims, 4 Drawing Sheets

METHOD FOR FABRICATING STACKED CAPACITOR OF SEMICONDUCTOR MEMORY DEVICE

BACKGROUND OF THE INVENTION

1. Field of the Invention

The present invention relates to a method for fabricating a highly integrated semiconductor memory device, and more particularly to a method for fabricating a semiconductor memory device, capable of obtaining a sufficient storage capacitance even when a memory cell area is reduced.

2. Description of the Prior Art

Generally, a semiconductor memory device such as a dynamic random access memory (DRAM) comprises a plurality of memory cells so as to store a large quantity of information. Each of the memory cells of the semiconductor memory device includes a capacitor for storing electric charges therein and a field effect transistor for opening and closing charge and discharge passages of the capacitor. As such since a DRAM has a higher integration degree, it is difficult to ensure a sufficient storage capacitance. This is because each memory cell of the DRAM has an abruptly reduced occupied area as the DRAM has the higher integration degree. Such a reduction in the occupied area of memory cell results in a reduction in the surface area of a storage electrode included in each capacitor. Actually, the storage electrode of each capacitor which constitutes each memory cell together with each corresponding field effect transistor is formed in the form of a plane plate shape over the field effect transistor. Due to such a shape, the storage electrode has a surface area abruptly reduced as the memory cell has a reduced occupied area. In this regard, conventional methods for fabricating memory cells have difficulties in increasing the surface area of storage electrode because they involve the formation of a storage electrode having a plane plate shape.

Referring to FIG. 1, there is illustrated a semiconductor memory device fabricated in accordance with one of the conventional methods. In FIG. 1, a semiconductor substrate 1 is shown which includes a field oxide film 2 formed on a predetermined portion of the semiconductor substrate 1, and a gate insulating film 3 and a word line 4 formed on an element region of the semiconductor substrate 1 defined by the field oxide film 2. Oxide film spacers 5 are formed on side walls of the word line 4, respectively. At exposed surface portions of the semiconductor substrate 1 defined by the oxide film spacers 5, source/drain diffusion regions 6 and 6' are formed, each of which has a lightly doped drain (LDD) structure. The source/drain diffusion regions 6 and 6' are formed by primarily implanting impurity ions in the semiconductor substrate 1 under a condition that the word line 4 is used as a mask, forming oxide film spacers on side walls of the word line 4, respectively, and then secondarily implanting impurity ions in the semiconductor substrate 1 under a condition that the oxide film spacers 5 are used as a mask. Together with the word line 4, the source/drain diffusion regions 6 and 6' constitute a field effect transistor.

Over the entire exposed surface of the resulting structure formed with the field effect transistor, an insulating oxide film 7 is coated. On the insulating oxide film 7, a storage electrode 11 is disposed which is in contact with a selected one of the source/drain diffusion regions 6 and 6'. The storage electrode 11 is formed by selectively etching the insulating oxide film 7, thereby forming a contact hole through which one of the source/drain diffusion regions 6 and 6' is exposed, forming a polysilicon layer over the entire exposed surface of the resulting structure obtained after the formation of the contact hole, and then patterning the polysilicon layer by use of a mask. On the upper surface and side walls of the storage electrode 11, a dielectric film 18 is formed using a growth process. The dielectric film 18 has a composite structure of an NO type constituted by a nitride film and an oxide film or an ONO type constituted by an oxide film, a nitride film and another oxide film. A plate electrode 19 is disposed over the entire exposed surface of the resulting structure obtained after the formation of the dielectric film 18. The plate electrode 19 is formed by forming a second polysilicon layer doped with an impurity over the entire exposed surface of the resulting structure obtained after the formation of the dielectric film 18, and then patterning the second polysilicon layer to have a predetermined dimension.

As apparent from the above description, the semiconductor device fabricated in accordance with the method of FIG. 1 has the storage electrode having the plane plate shape. Due to such a plane plate shape of the storage electrode, it is impossible to obtain a sufficient storage capacitance when the memory cell has a reduced occupied area. As a result, it is difficult for the conventional semiconductor memory device to have a high integration degree because of the insufficient storage capacitance.

SUMMARY OF THE INVENTION

Therefore, an object of the present invention is to provide a method for fabricating a capacitor of a semiconductor memory device, capable of obtaining a sufficient storage capacitance even when a memory cell area is reduced, thereby improving the integration degree of the semiconductor memory device.

In accordance with the present invention, this object can be accomplished by providing a method for fabricating a capacitor of a semiconductor memory device, comprising the steps of: preparing a semiconductor substrate formed with a transistor having an impurity diffusion region; sequentially forming a planarized insulating oxide film, a barrier layer and a first electrode layer over the semiconductor substrate; etching respective predetermined portions of the first electrode layer, the barrier layer and the insulating oxide film in a continued manner in accordance with an etch process using a contact hole mask, thereby forming a first contact hole; forming electrode material spacers respectively on side walls of the first contact hole such that the insulating oxide film is partially exposed through a region defined by the electrode material spacers; forming a second contact hole for exposing the impurity diffusion region in accordance with a selective etch process using the first electrode layer and the electrode material spacers as an etch barrier; forming a second electrode layer over the entire exposed surface of the resulting structure obtained after the formation of the second contact hole such that the second electrode layer is in electrical contact with the impurity diffusion region; forming a sacrificial oxide film pattern having a bird's beak shape on a portion of the second electrode layer disposed around the first contact hole; sequentially etching the second electrode layer and the first electrode layer under a condition that the sacrificial oxide film pattern is used as an etch barrier until an upper surface of the barrier layer is exposed, thereby forming a second-electrode layer pattern and a first-electrode layer pattern; wet etching the sacrificial oxide film pattern, thereby completely exposing an upper surface of the second-electrode layer pattern; and sequentially forming a dielectric film and a plate electrode over exposed surfaces of the first-electrode layer pattern and the second-electrode layer pattern.

BRIEF DESCRIPTION OF THE DRAWINGS

These and other objects, features and advantages of the invention will become more apparent upon reading the following detailed specification and drawings, in which.

DETAILED DESCRIPTION OF THE PREFERRED EMBODIMENTS

Figure 2:
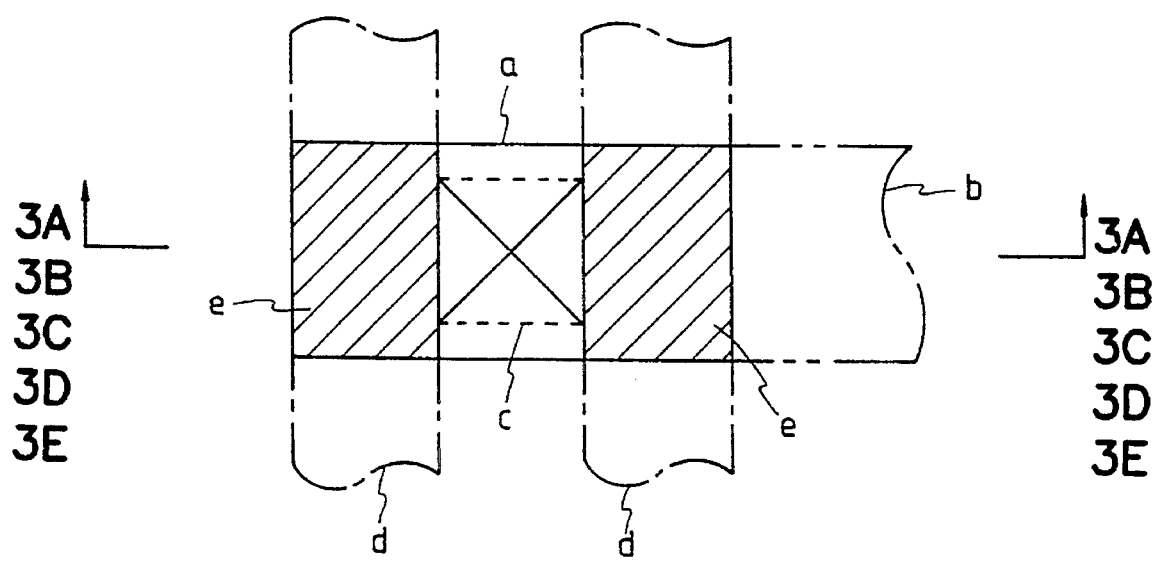
FIG. 2 is a plan view illustrating positions of mask patterns to be used in the fabrication of a capacitor of a semiconductor memory device in accordance with the present invention.

FIG. 2 is a plan view illustrating positions of mask patterns to be used in the fabrication of a capacitor of a semiconductor memory device in accordance with the present invention. In FIG. 2, various regions a to e are shown. The first region a represents a pattern of a storage electrode mask for defining a charge storage region, while the second region b represents a pattern of a mask for active region isolation adapted to isolate a region where a memory cell is disposed. The third region c represents a pattern of a mask adapted to be used for formation of a contact hole, while the fourth region d represents a pattern of a mask adapted to be used for formation of a gate electrode and a word line. On the other hand, the fifth region e represents a pattern of a mask for defining a sacrificial oxide film pattern to be used in the fabrication of the capacitor in accordance with the present invention.

Figure 1:
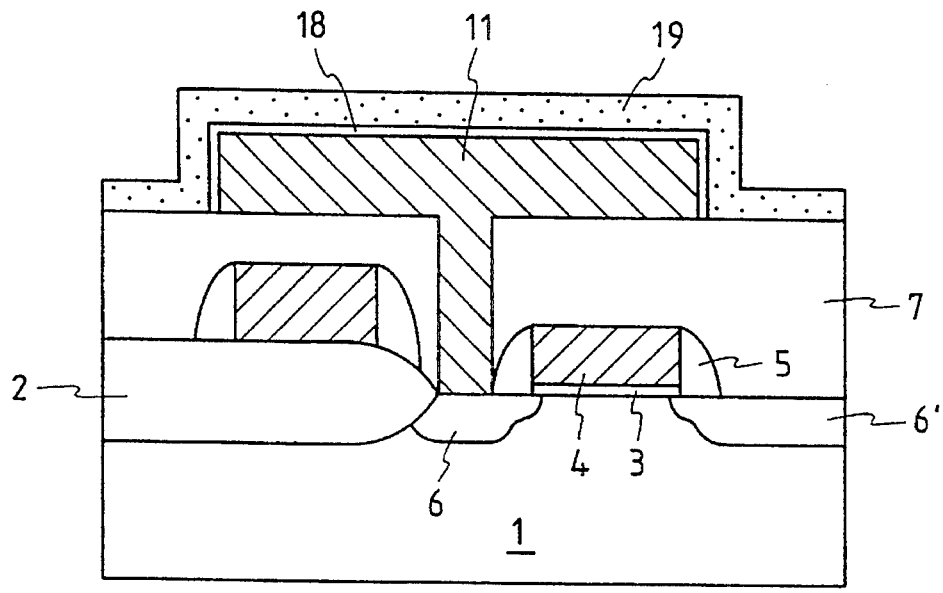
FIG. 1 is a sectional view illustrating a semiconductor memory device fabricated in accordance with a conventional fabrication method.

FIGS. 3A to 3E are sectional views respectively illustrating a method for fabricating a capacitor of a semiconductor memory device in accordance with a first embodiment of the present invention. The figures are cross-sectional views taken along the line A—A' of FIG. 2, respectively. In FIGS. 3A to 3E, elements corresponding to those in FIG. 1 are denoted by the same reference numerals.

Figure 3A:
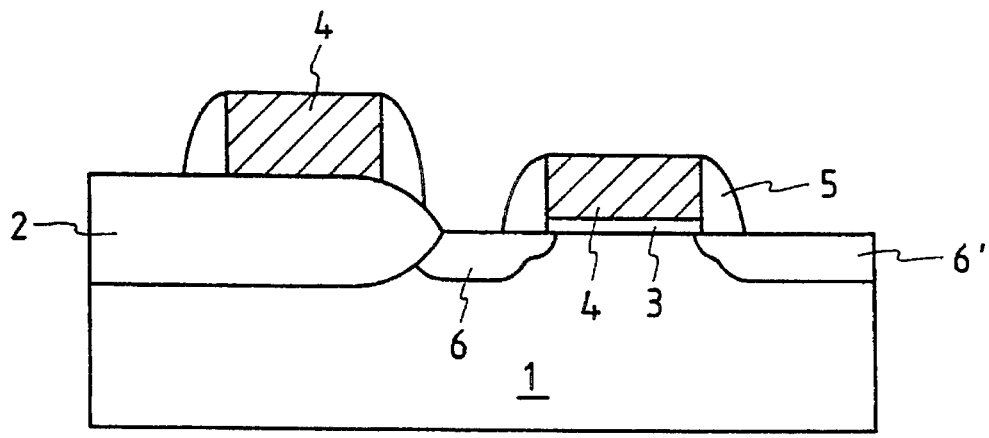
FIGS. 3A to 3E are sectional views respectively illustrating a method for fabricating a capacitor of a semiconductor memory device in accordance with a first embodiment of the present invention.

In accordance with this method, a semiconductor substrate 1 is prepared which is formed with a field oxide film 2 at its predetermined portion where a P-well (or N-well) is formed, as shown in FIG. 3A. The field oxide film 2 is formed by growing an oxide film on the predetermined portion of semiconductor substrate 1 in accordance with a local oxidation of silicon (LOCOS) process by use of a mask which may be the mask b for active region isolation. The semiconductor substrate 1 is also formed with a gate insulating film 3 and a word line 4 at an element region defined by the field oxide film 2. The word line 4 is formed together with a gate electrode by depositing a polysilicon film over the semiconductor substrate 1 formed with the field oxide film 2, implanting impurity ions in the polysilicon film, and patterning the polysilicon film by use of a mask for gate electrode/word line which may be the mask d. Oxide film spacers 5 are formed on side walls of the word line 4, respectively. At exposed surface portions of the semiconductor substrate 1 defined by the oxide film spacers 5, source/drain diffusion regions 6 and 6' are formed, each of which has an LDD structure. The source/drain diffusion regions 6 and 6' are formed by primarily implanting impurity ions of a low concentration in the semiconductor substrate 1 under a condition that the gate electrode and word line 4 are used as a mask, forming oxide film spacers on side walls of the gate electrode and word line 4, respectively, and then secondarily implanting impurity ions of a high concentration in the semiconductor substrate 1 under a condition that the oxide film spacers 5 are used as a mask. Together with the word line 4, the source/drain diffusion regions 6 and 6' constitute a field effect transistor.

Figure 3B:
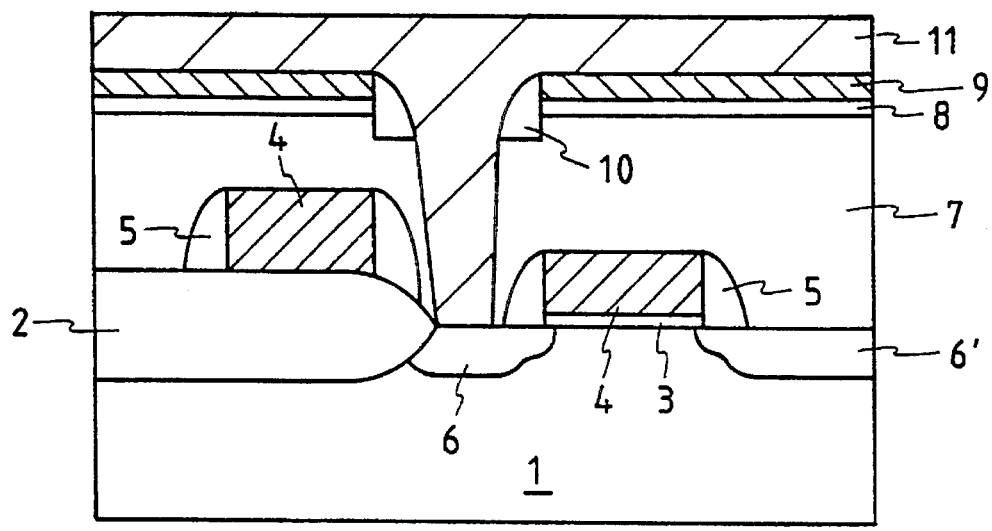

Over the entire exposed surface of the resulting structure formed with the field effect transistor, a planarized insulating oxide film 7, a barrier layer 8, a first electrode layer 9 and a second electrode layer 11 are formed in a sequential manner, as shown in FIG. 3B. Electrode material spacers are also formed between the insulating oxide film 7 and the second electrode layer 11. The insulating oxide film 7 is formed by depositing an insulating material to a predetermined thickness over the entire exposed surface of the resulting structure formed with the field effect transistor, and then fully etching a predetermined portion of the insulating material film. The barrier layer 8 is formed by coating a silicon nitride to a predetermined thickness over the insulating oxide film 7. The first electrode layer 9 is formed by depositing a polysilicon over the barrier layer 8. The electrode material spacers 10 are formed by sequentially etching predetermined portions of the first electrode layer 9, barrier layer 8 and upper portion of insulating oxide film 7 to form a first contact hole by use of a mask which may be the contact hole mask c of FIG. 2, depositing a polysilicon to a predetermined thickness over the entire exposed surface of the resulting structure obtained after the formation of the first contact hole, and then anisotropically etching the polysilicon layer. On the other hand, the second electrode layer 11 fills a space defined by the electrode material spacers 10 and the first contact hole formed in the insulating oxide film 7 so that it is in electrical contact with a selected one of the source/drain diffusion regions 6 and 6'. The second electrode layer 11 is formed by etching an exposed portion of the insulating oxide film 7 defined by the electrode material spacers 10 to form a second contact hole through which the selected one of the source/drain diffusion regions 6 and 6' is exposed, and then depositing a polysilicon doped with an impurity over the entire exposed surface of the resulting structure obtained after the formation of the second contact hole. Each of the first electrode layer 9 and the electrode material spacers 10 is made of a pure polysilicon in order to improve its etch selectivity to the insulating oxide film 7. The first electrode layer 9 and the electrode material spacers 10 will contain an impurity diffused from the second electrode layer 11 upon subsequently forming a dielectric film.

Figure 3C:
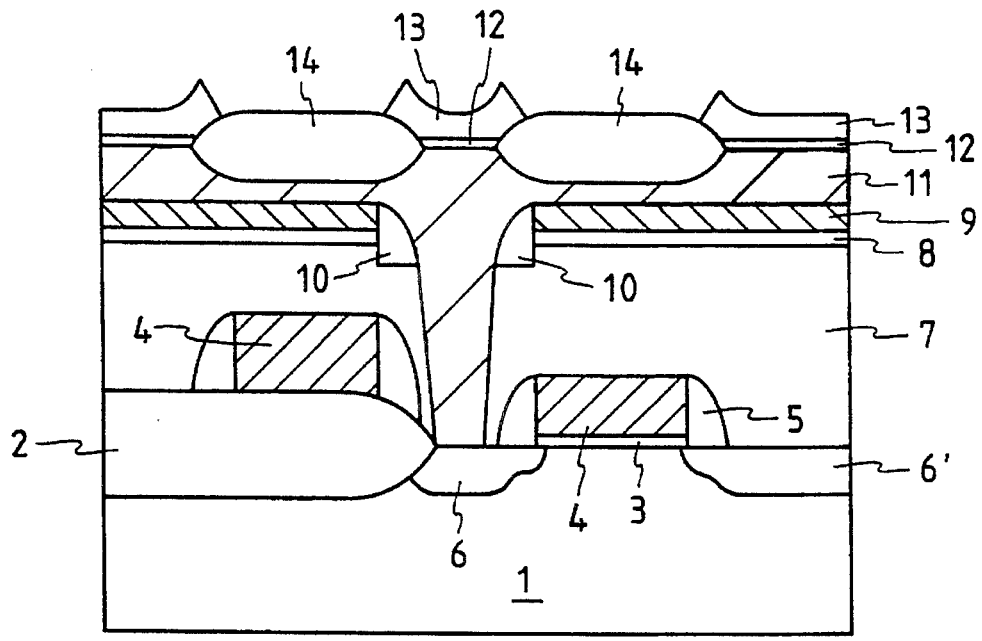

Over the second electrode layer 11, a pad oxide film pattern 12, a silicon nitride film pattern 13 and a sacrificial oxide film pattern 14 are formed, as shown in FIG. 3C. The formation of the pad oxide film pattern 12 and the silicon nitride film pattern 13 is achieved by sequentially forming a pad oxide film having a predetermined thickness and a silicon nitride film having a predetermined thickness over the second electrode layer 11, and then selectively etching the pad oxide film and the silicon nitride film, in a sequential manner, by use of a mask which may be the sacrificial oxide film pattern mask e of FIG. 2. The sacrificial oxide film pattern 14 is formed by growing an oxide film in the form of a bird's beak on an exposed surface portion of the second electrode layer 11 not disposed beneath the pad oxide film pattern 12 and the silicon nitride film pattern 13 by use of a high temperature oxidation process. During the high temperature oxidation process, the oxidation is generated along polysilicon grains of the second electrode layer 11. As a result, the second electrode layer 11 has a rough surface at its portion that is in contact with the sacrificial oxide film pattern. The sacrificial oxide film pattern 14 has pattern portions respectively disposed in both sides of a region where the first contact hole is defined. After the formation of the sacrificial oxide film pattern 14, both the silicon nitride film pattern 13 and the pad oxide film pattern 12 are removed.

Figure 3D:
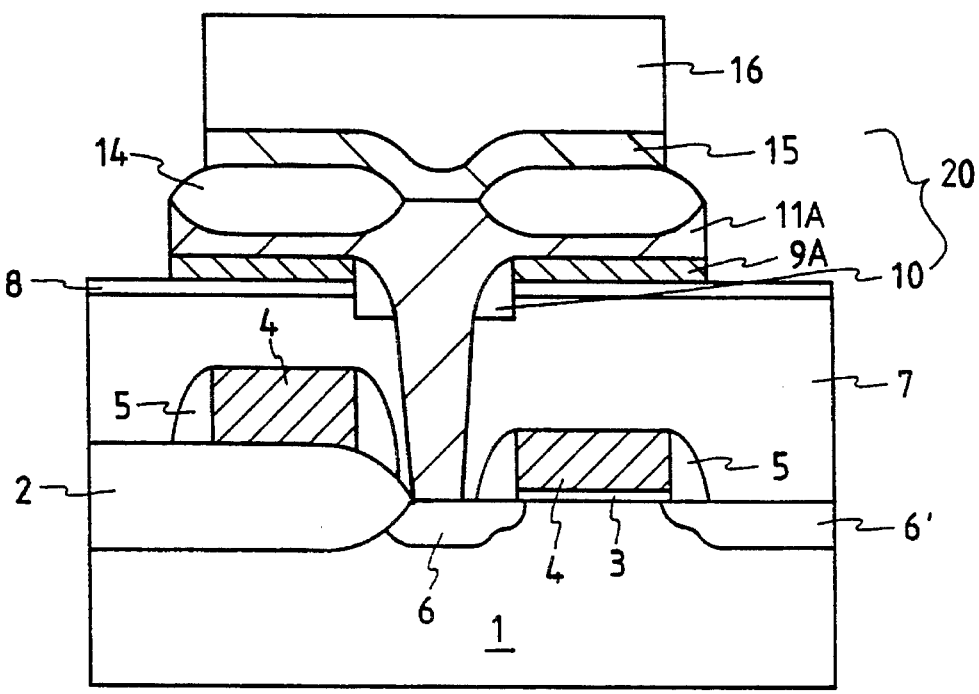

Thereafter, formations of a third-electrode layer pattern 15 and a photoresist pattern 16 are carried out, as shown in FIG. 3D. The formation of the third-electrode layer pattern 15 is achieved by depositing a polysilicon doped with an impurity over the entire exposed surface of the resulting structure obtained after the removal of the patterns 12 and 13, forming the photoresist pattern 16 on the deposited polysilicon layer, namely, the third electrode layer, and then removing an exposed portion of the polysilicon layer not disposed beneath the photoresist pattern 16 by use of an etch process. The formation of the photoresist pattern 16 is achieved by coating a photoresist film over the polysilicon layer deposited for the third-electrode layer pattern 15, selectively exposing the photoresist film to light by use of a mask which may be the storage electrode mask a of FIG. 2, and then developing the selectively exposed photoresist film. After the formation of the third-electrode layer pattern 15, both the second electrode layer 11 and the first electrode layer 9 are selectively removed in accordance with an etch process using the photoresist film pattern 16 and the sacrificial oxide film pattern 14 as an etch barrier, thereby forming a second-electrode layer pattern 11A and a first-electrode layer pattern 9A. After the formation of the patterns 9A and 11A, the photoresist film pattern 16 is removed. As a result, the third-electrode layer pattern 15 is exposed at its upper surface. Subsequently, the sacrificial oxide film pattern 14 is also removed by use of a wet etch process, thereby exposing the upper surface of the second electrode layer pattern 11A and the lower surface of the third-electrode layer pattern 15. Thus, a storage electrode 20 is obtained which is constituted by the first-electrode layer pattern 9A, the second-electrode layer pattern 11A, the third-electrode layer pattern 15 and the electrode material spacers 10 all being integral with one another.

Figure 3E:
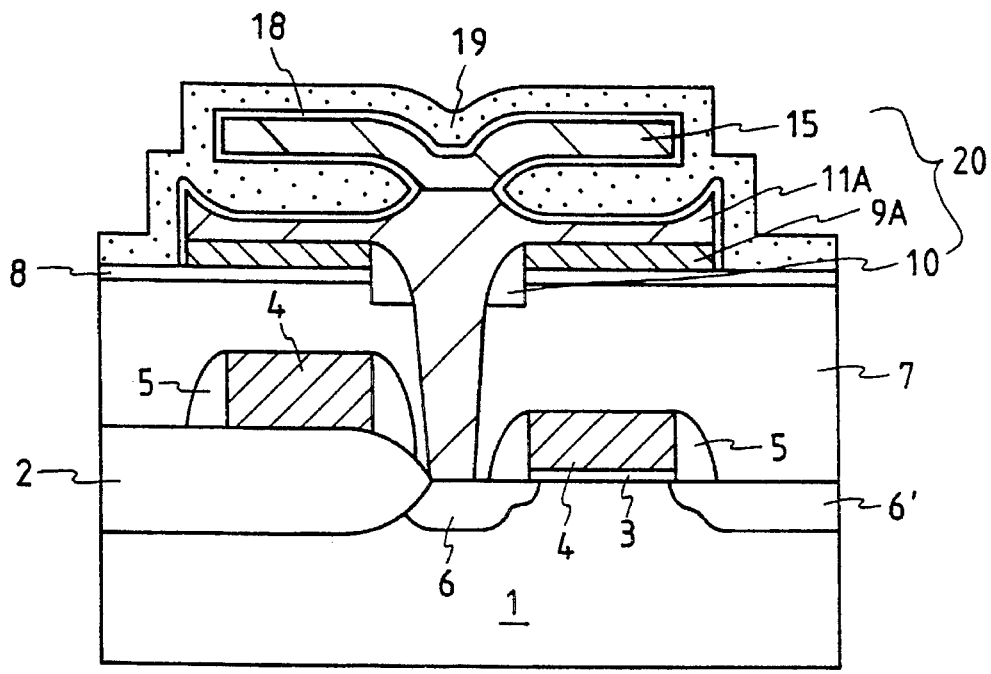

Over the entire exposed surface of the storage electrode 20, a dielectric film 18 is then formed, as shown in FIG. 3E. The formation of the dielectric film 18 is achieved by growing a composite dielectric film structure of NO or ONO over the entire exposed surface of the storage electrode 20. A plate electrode 19 is then formed on the dielectric film 18. The formation of the plate electrode 19 is achieved by depositing a polysilicon doped with an impurity over the entire exposed surface of the resulting structure obtained after the formation of the dielectric film 18, and then patterning the deposited polysilicon layer to a predetermined dimension. The first-electrode layer pattern 9A and the electrode material spacers 10 contain an impurity diffused from the second-electrode layer pattern 11A at a subsequent step involving the step of forming the dielectric film 18 and the plate electrode 19. By the impurity diffused from the second-electrode layer pattern 11A, the first electrode layer pattern 9A and the electrode material spacers 10 have a conduction characteristic.

Otherwise, the second electrode layer 11 may be made of a pure polysilicon, in place of the impurity-doped polysilicon. In this case, the second-electrode layer pattern 11A will contain an impurity diffused from the third-electrode layer pattern 15 at the subsequent step involving the step of forming the dielectric film 18 and the plate electrode 19. Accordingly, the first-electrode layer pattern 9A and the electrode material spacers 10 will contain the impurity diffused from the third-electrode layer pattern 15 via the second-electrode layer pattern 11A.

The storage electrode 20 has a large surface area obtained by greatly increasing the area of the sacrificial oxide film pattern 14 having the bird's beak shape. This results from the structure that the storage electrode 20 is spaced a minimum distance apart from a storage electrode (not shown) of an adjacent memory cell. The area of the sacrificial oxide film pattern 14 can be controlled by varying the thickness of the sacrificial oxide film pattern 14.

Figure 4:
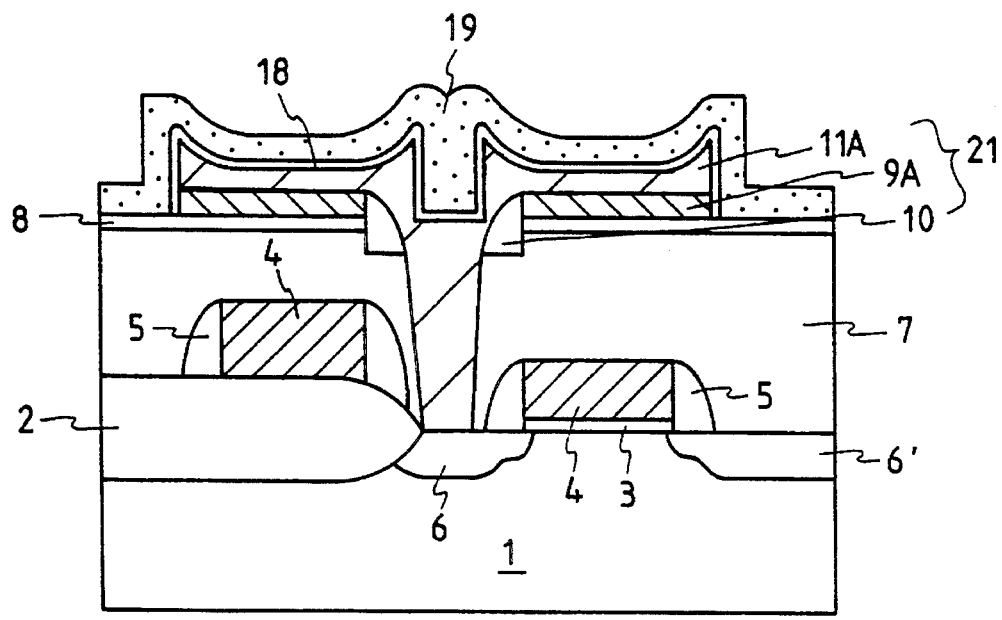
FIG. 4 is a sectional view illustrating a method for fabricating a capacitor of a semiconductor memory device in accordance with a second embodiment of the present invention.

FIG. 4 is a sectional view illustrating a method for fabricating a capacitor of a semiconductor memory device in accordance with a second embodiment of the present invention. In accordance with the method of FIG. 4, the same steps as those shown in FIGS. 3A to 3C are carried out. Accordingly, the following description will be made only in conjunction with process steps following those shown in FIGS. 3A to 3C. In FIG. 4, elements respectively corresponding to those in FIGS. 3A to 3E are denoted by the same reference numerals.

As shown in FIG. 4, the first-electrode layer pattern 9A, the second-electrode layer pattern 11A and the electrode material spacers 10 constitute a storage electrode 21 together. Under this condition, a second-electrode layer pattern 11A and a first-electrode layer pattern 9A are formed by selectively removing the second electrode layer 11 and the first electrode layer 9 in accordance with the etch process using the sacrificial oxide film pattern 14 having the bird's beak shape as an etch barrier so that the barrier layer 8 is exposed. Thereafter, the sacrificial oxide film pattern 14 is removed in accordance with an etch process using the barrier layer 8 as an etch barrier. As a result, the second-electrode layer pattern 11A is exposed at its upper surface. Over the entire exposed surface of the storage electrode 21, a dielectric film 18 and a plate electrode 19 are then formed in a sequential manner. The formation of the dielectric film 18 is achieved by growing a composite dielectric film structure of NO or ONO over the entire exposed surface of the storage electrode 21. On the other hand, the plate electrode 19 is formed by depositing a polysilicon doped with an impurity over the entire exposed surface of the resulting structure obtained after the formation of the dielectric film 18, and then patterning the deposited polysilicon layer to a predetermined dimension. In place of the impurity-doped polysilicon, the plate electrode 19 is made of a polycide.

As apparent from the above description, the present invention provides a method for fabricating a capacitor of a semiconductor memory device, capable of providing a storage electrode having a large effective surface area as compared to a limited occupied area of a corresponding memory cell by constituting the storage electrode by a double electrode layer pattern structure, forming a rough surface at the upper surface of the electrode layer pattern structure, and forming curved surfaces at upper and lower surfaces of each pattern of the electrode layer pattern structure. By virtue of the large surface area of the storage electrode, the capacitor fabricated in accordance with the method of the present invention has a large storage capacitance as compared to the limited occupied area of the corresponding memory cell. As a result, it is possible to achieve an improvement in the integration degree of the semiconductor memory device.

Although the preferred embodiments of the invention illustrated in FIGS. 3A to 3E and FIG. 4 have been disclosed for illustrative purposes, those skilled in the art will appreciate that various modifications, additions and substitutions are possible, without departing from the scope and spirit of the invention as disclosed in the accompanying claims.

For example, the storage electrode may be constituted by at least three electrode layer patterns. In this case, at least two additional electrode layers and at least one sacrificial oxide film pattern having the bird's beak shape are formed in an alternating manner over the structure obtained after completion of the step shown in FIG. 3C, namely, the structure including the second electrode layer 11 and the sacrificial oxide film pattern 14. The additional electrode layers are then patterned in accordance with an etch process using the additional sacrificial oxide film pattern as an etch barrier so as to expose the barrier layer 8.

The barrier layer 8 which is formed at the step of FIG. 3B may be omitted. In this case, the insulating oxide film 7 formed at the step of FIG. 3B is undercut upon wet etching the sacrificial oxide film pattern 14 at the step of FIG. 3E or FIG. 4 so as to expose the edge portion of the lower surface of first-electrode layer pattern 9A.

What is claimed is:

1. A method for fabricating a capacitor of a semiconductor memory device, comprising the steps of:

preparing a semiconductor substrate formed with a transistor having an impurity diffusion region;

sequentially forming a planarized insulating oxide film, a barrier layer, and a first electrode layer over the semiconductor substrate;

etching respective portions of the first electrode layer, the barrier layer and the insulating oxide film in a continued manner in accordance with an etch process using a contact hole mask, thereby forming a first contact hole;

forming electrode material spacers respectively on side walls of the first contact hole such that the insulating oxide film is partially exposed through a region defined by the electrode material spacers;

forming a second contact hole for exposing the impurity diffusion region in accordance with a selective etch process using the first electrode layer and the electrode material spacers as an etch barrier;

forming a second electrode layer after the formation of the second contact hole such that the second electrode layer is in electrical contact with the impurity diffusion region;

growing a sacrificial oxide film pattern having a bird's beak shape on a portion of the second electrode layer disposed in both sides of a region where the first contact hole is located;

sequentially etching the second electrode layer and the first electrode layer under a condition that the sacrificial oxide film pattern is used as an etch barrier until an upper surface of the barrier layer is exposed, thereby forming a second-electrode layer pattern and a first-electrode layer pattern;

wet etching the sacrificial oxide film pattern, thereby completely exposing an upper surface of the second-electrode layer pattern; and sequentially forming a dielectric film and a plate electrode over the first-electrode layer pattern and the second-electrode layer pattern.

2. A method in accordance with claim 1, further comprising the step of forming at least two additional electrode layers and at least one additional sacrificial oxide film pattern having a bird's beak shape in an alternating manner on both the second-electrode layer and the sacrificial oxide film pattern.

3. A method in accordance with claim 1, wherein the electrode material spacers and the first electrode layer are made of a polysilicon for improving an etch selectivity thereof to the insulating oxide film.

4. A method in accordance with claim 3, wherein the second electrode layer contains an impurity for exhibiting a conduction characteristic, the impurity being diffused in the electrode material spacers and the first electrode layer at the step of forming the dielectric film.

5. A method in accordance with claim 4, wherein the sacrificial oxide film pattern is grown along polysilicon grains of the second electrode layer in accordance with an oxidation process so that the second-electrode layer pattern has a rough upper surface.

6. A method for fabricating a capacitor of a semiconductor memory device, comprising the steps of:

preparing a semiconductor substrate formed with a transistor having an impurity diffusion region;

sequentially forming a planarized insulating oxide film and a first electrode layer over the semiconductor substrate;

etching respective portions of the first electrode layer and the insulating oxide film in a continued manner in accordance with an etch process using a contact hole mask, thereby forming a first contact hole;

forming electrode material spacers respectively on side walls of the first contact hole such that the insulating oxide film is partially exposed through a region defined by the electrode material spacers;

forming a second contact hole for exposing the impurity diffusion region in accordance with a selective etch process using the first electrode layer and the electrode material spacers as an etch barrier;

forming a second electrode layer after the formation of the second contact hole such that the second electrode layer is in electrical contact with the impurity diffusion region;

growing a sacrificial oxide film pattern having a bird's beak shape on a portion of the second electrode layer disposed in both sides of a region where the first contact hole is located;

sequentially etching the second electrode layer and the first electrode layer under a condition that the sacrificial oxide film pattern is used as an etch barrier until an upper surface of the insulating oxide film is exposed, thereby forming a second-electrode layer pattern and a first-electrode layer pattern;

wet etching the sacrificial oxide film pattern, thereby completely exposing an upper surface of the second-electrode layer pattern; and sequentially forming a dielectric film and a plate electrode over the first-electrode layer pattern and the second-electrode layer pattern.

7. A method in accordance with claim 6, wherein the insulating oxide film is undercut upon removing the sacrificial oxide film pattern so that the first-electrode layer pattern is exposed at an edge portion of a lower surface thereof.

8. A method in accordance with claim 6, further comprising the step of forming at least two additional electrode layers and at least one additional sacrificial oxide film pattern having a bird's beak shape in an alternating manner on both the second-electrode layer and the sacrificial oxide film pattern.

9. A method in accordance with claim 8, wherein the insulating oxide film is undercut upon removing the sacrificial oxide film pattern so that the first-electrode layer pattern is exposed at an edge portion of a lower surface thereof.

10. A method in accordance with claim 9, wherein the electrode material spacers and the first electrode layer are made of a polysilicon for improving an etch selectivity thereof to the insulating oxide film.

11. A method in accordance with claim 10, wherein the second electrode layer contains an impurity for exhibiting a conduction characteristic, the impurity being diffused in the electrode material spacers and the first electrode layer at the step of forming the dielectric film.

12. A method in accordance with claim 11, wherein the sacrificial oxide film pattern is grown along polysilicon grains of the second electrode layer in accordance with an oxidation process so that the second-electrode layer pattern has a rough upper surface.

13. A method for fabricating a capacitor of a semiconductor memory device, comprising the steps of:

preparing a semiconductor substrate formed with a transistor having an impurity diffusion region;

sequentially forming a planarized insulating oxide film and a first electrode layer over the semiconductor substrate;

etching respective portions of the first electrode layer and the insulating oxide film in a continued manner in accordance with an etch process using a contact hole mask, thereby forming a contact hole;

forming a second electrode layer after the formation of the contact hole such that the second electrode layer is in electrical contact with the impurity diffusion region;

growing a sacrificial oxide film pattern having a bird's beak shape on a portion of the second electrode layer disposed in both sides of a region where the contact hole is located;

forming a third electrode layer after the formation of the sacrificial oxide film pattern;

forming a photoresist film pattern on the third electrode layer such that the photoresist film pattern overlaps with a region defined around the contact hole and a portion of the sacrificial oxide film pattern;

etching the third electrode layer by use of the photoresist pattern as an etch barrier until the sacrificial oxide film pattern is exposed, thereby forming a third-electrode layer pattern;

sequentially etching the second electrode layer and the first electrode layer under a condition that the photoresist pattern and an exposed portion of the sacrificial oxide film pattern is used as an etch barrier until the insulating oxide film is exposed, thereby forming a second-electrode layer pattern and a first-electrode layer pattern;

removing the photoresist pattern, thereby exposing an upper surface of the third-electrode layer pattern;

wet etching the sacrificial oxide film pattern, thereby completely exposing an upper surface of the second-electrode layer pattern and a lower surface of the third-electrode layer pattern; and sequentially forming a dielectric film and a plate electrode over the first-electrode layer pattern, the second-electrode layer pattern and the third-electrode layer pattern.

14. A method in accordance with claim 13, wherein the insulating oxide film is undercut upon removing the sacrificial oxide film pattern so that the first-electrode layer pattern is exposed at an edge portion of a lower surface thereof.

15. A method in accordance with claim 14, wherein the third electrode layer is made of a polysilicon containing an impurity for exhibiting a conduction characteristic, and the first and second electrode layers are made of a pure polysilicon, the impurity of the third electrode layer being diffused in the pure polysilicon of the first and second electrode layers at the step of forming the dielectric film.

16. A method in accordance with claim 15, wherein the sacrificial oxide film pattern is grown along polysilicon grains of the second electrode layer in accordance with oxidation process so that the second-electrode layer pattern has a rough upper surface.

17. A method in accordance with claim 16, further comprising the step of forming at least two additional electrode layers and at least one additional sacrificial oxide film pattern having a bird's beak shape in an alternating manner on both the second-electrode layer and the sacrificial oxide film pattern.

18. A method for fabricating a capacitor of a semiconductor memory device, comprising the steps of:

preparing a semiconductor substrate formed with a transistor having an impurity diffusion region;

sequentially forming a planarized insulating oxide film, a barrier layer, and a first electrode layer over the semiconductor substrate;

etching respective portions of the first electrode layer, the barrier layer and the insulating oxide film in a continued manner in accordance with an etch process using a contact hole mask, thereby forming a first contact hole;

forming electrode material spacers respectively on side walls of the first contact hole such that the insulating oxide film is partially exposed through a region defined by the electrode material spacers;

forming a second contact hole for exposing the impurity diffusion region in accordance with a selective etch process using the first electrode layer and the electrode material spacers as an etch barrier;

forming a second electrode layer after the formation of the second contact hole such that the second electrode layer is in electrical contact with the impurity diffusion region;

growing a sacrificial oxide film pattern having a bird's beak shape on a portion of the second electrode layer disposed in both sides of a region where the first contact hole is located;

forming a third-electrode layer after the formation of the sacrificial oxide film pattern;

forming a photoresist film pattern on the third electrode layer such that the photoresist film pattern overlaps with a region defined around the first contact hole and a portion of the sacrificial oxide film pattern;

etching the third electrode layer by use of the photoresist pattern as an etch barrier until the sacrificial oxide film pattern is partially exposed, thereby forming a third-electrode layer pattern;

sequentially etching the second electrode layer and the first electrode layer under a condition that the photoresist pattern and an exposed portion of the sacrificial oxide film pattern is used as an etch barrier until the barrier layer is exposed, thereby forming a second-electrode layer pattern and a first-electrode layer pattern;

removing the photoresist pattern, thereby exposing an upper surface of the third-electrode layer pattern;

wet etching the sacrificial oxide film pattern, thereby completely exposing an upper surface of the second-electrode layer pattern and a lower surface of the third-electrode layer pattern; and sequentially forming a dielectric film and a plate electrode over the first-electrode layer pattern, the second-electrode layer pattern and the third-electrode layer pattern.

19. A method in accordance with claim 18, wherein the third electrode layer is made of a polysilicon containing an impurity for exhibiting a conduction characteristic, and the first and second electrode layers and the electrode material spacers are made of a pure polysilicon, the impurity of the third electrode layer being diffused in the pure polysilicon of the first and second electrode layers and the electrode material spacers at the step of forming the dielectric film.

20. A method in accordance with claim 19, wherein the sacrificial oxide film pattern is grown along polysilicon grains of the second electrode layer in accordance with an oxidation process so that the second-electrode layer pattern has a rough upper surface.

21. A method in accordance with claim 20, further comprising the step of forming at least two additional electrode layers and at least one additional sacrificial oxide film pattern having a bird's beak shape in an alternating manner on both the second-electrode layer and the sacrificial oxide film pattern.

\* \* \* \* \*